United States Patent
Lee

(10) Patent No.: US 12,200,935 B2
(45) Date of Patent: Jan. 14, 2025

(54) 3D AND FLASH MEMORY DEVICE AND METHOD OF FABRICATING THE SAME

(71) Applicant: MACRONIX International Co., Ltd., Hsinchu (TW)

(72) Inventor: Guan-Ru Lee, Hsing-Chu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 548 days.

(21) Appl. No.: 17/684,271

(22) Filed: Mar. 1, 2022

(65) Prior Publication Data
US 2023/0284446 A1    Sep. 7, 2023

(51) Int. Cl.
*H10B 43/27*    (2023.01)

(52) U.S. Cl.
CPC ................................. *H10B 43/27* (2023.02)

(58) Field of Classification Search
CPC ........ H10B 43/27; H10B 43/20; H10B 43/10; H01L 29/40117; H01L 29/792
USPC ............................................ 365/182, 185.24
See application file for complete search history.

(56) References Cited

U.S. PATENT DOCUMENTS

| | | | | |
|---|---|---|---|---|
| 8,450,176 B2 * | 5/2013 | Son | ......................... | H10B 43/20 |
| | | | | 257/E21.422 |
| 2011/0143524 A1 * | 6/2011 | Son | ......................... | H10B 43/20 |
| | | | | 438/479 |
| 2012/0086072 A1 * | 4/2012 | Yun | .................... | H01L 21/31111 |
| | | | | 257/329 |
| 2014/0061776 A1 * | 3/2014 | Kwon | ..................... | H10B 41/27 |
| | | | | 257/329 |
| 2015/0262826 A1 * | 9/2015 | Yun | ...................... | H01L 29/7926 |
| | | | | 438/269 |
| 2020/0066741 A1 * | 2/2020 | Wu | .......................... | H10B 41/10 |
| 2020/0328229 A1 | 10/2020 | Kim et al. | | |
| 2020/0381450 A1 * | 12/2020 | Lue | .......................... | H10B 43/27 |
| 2021/0074725 A1 * | 3/2021 | Lue | .................... | H01L 29/78391 |
| 2021/0193677 A1 * | 6/2021 | Lue | .................... | H01L 29/42344 |
| 2022/0028880 A1 | 1/2022 | Shirota | | |
| 2022/0130862 A1 * | 4/2022 | Lue | .......................... | H10B 51/20 |

FOREIGN PATENT DOCUMENTS

| | | |
|---|---|---|
| TW | 202114181 | 4/2021 |
| TW | 739348 | 9/2021 |
| TW | 202203379 | 1/2022 |

OTHER PUBLICATIONS

"Office Action of Taiwan Counterpart Application", issued on Jan. 18, 2023, p. 1-p. 6.

* cited by examiner

*Primary Examiner* — Michael T Tran
(74) *Attorney, Agent, or Firm* — J.C. PATENTS

(57) ABSTRACT

A 3D AND flash memory device includes a gate stack structure, a channel stack structure, a source pillar and a drain pillar, and a plurality of charge storage structures. The gate stack structure is located on the dielectric substrate. The gate stack structure includes a plurality of gate layers and a plurality of insulating layers stacked alternately with each other. The channel stack structure extends through the gate stack structure. The channel stack structure includes a plurality of channel rings spaced apart from each other. The source pillar and the drain pillar are located in the channel stack structure and are respectively electrically connected to the plurality of channel rings. The plurality of charge storage structures are located between the plurality of gate layers and the plurality of channel rings.

14 Claims, 17 Drawing Sheets

3D AND FLASH MEMORY DEVICE AND METHOD OF FABRICATING THE SAME

BACKGROUND

Technical Field

The embodiment of the disclosure relates to a semiconductor device and a method of fabricating the same, and particularly to a three-dimensional (3D) AND flash memory device and a method of fabricating the same.

Description of Related Art

Since a non-volatile memory has the advantage that stored data does not disappear at power-off, it becomes a widely used memory for a personal computer or other electronics equipment. Currently, the 3D memory commonly used in the industry includes a NOR memory and a NAND memory. In addition, another 3D memory is an AND memory, which may be applied to a multi-dimensional memory array with high integration and high area utilization, and has an advantage of a fast operation speed. Therefore, the development of a 3D AND flash memory device has gradually become the current trend.

SUMMARY

The disclosure provides a 3D AND flash memory device in which a plurality of channel regions are separated from each other, so as to reduce the leakage current.

The disclosure provides a method of forming a 3D AND flash memory device. The method of the disclosure can be integrated with the existing process to form a plurality of channel regions separated from each other and therefore reduce the leakage current.

A 3D AND flash memory device according to an embodiment of the disclosure includes a gate stack structure, a channel stack structure, a source pillar and a drain pillar, and a plurality of charge storage structures. The gate stack structure is located on the dielectric substrate. The gate stack structure includes a plurality of gate layers and a plurality of insulating layers stacked alternately with each other. The channel stack structure extends through the gate stack structure. The channel stack structure includes a plurality of channel rings spaced apart from each other. The source pillar and the drain pillar are located in the channel stack structure and are respectively electrically connected to the plurality of channel rings. The plurality of charge storage structures are located between the plurality of gate layers and the plurality of channel rings.

According to an embodiment of the disclosure, the plurality of insulating layers include a plurality of body portions and a plurality of extending portions. The plurality of body portions and the plurality of gate layers alternately stacked. The plurality of extending portions are connected to the plurality of body portions, wherein the plurality of extending portions and the plurality of channel rings are alternately stacked to form the channel stack structure.

According to an embodiment of the disclosure, a height of the plurality of extending portions is less than a height of the plurality of body portions.

According to an embodiment of the disclosure, a height of the plurality of extending portions is equal to a height of the plurality of body portions.

According to an embodiment of the disclosure, a height of the plurality of extending portions is greater than a height of the plurality of body portions.

According to an embodiment of the disclosure, at least one of the plurality of insulating layers has an interface, a slit or a void.

A method of fabricating a 3D AND flash memory device, includes: forming an intermediate stack structure on dielectric substrate, wherein the intermediate stack structure includes a plurality of first intermediate layers and a plurality of second intermediate layers alternately stacked; forming an opening in the intermediate stack structure; forming a protection pillar on a sidewall of the opening; forming a channel pillar on a sidewall of the protection pillar; forming a source pillar and a drain pillar in the channel pillar, wherein the source pillar and the drain pillar are electrically connected to the channel pillar; removing the plurality of first intermediate layers by using the protection pillar as a stop layer, so as to form a plurality of first horizontal openings; removing a portion of the protection pillar exposed by the plurality of first horizontal openings and cutting the channel pillar, so as to form a plurality of ring spaces, a plurality of protection rings and a plurality of channel rings, wherein the plurality of protection rings and the plurality of channel rings are separated by the plurality of ring spaces; forming a plurality of insulating layers in the plurality of first horizontal openings and the plurality of ring spaces, wherein the plurality of channel rings and the plurality of insulating layers filled in the plurality of ring spaces are alternately stacked to from a channel stack structure; removing the plurality of the second intermediate layers and the plurality of protection rings, so as to form a plurality of second horizontal openings; filling a plurality of gate layers in the plurality of second horizontal openings, wherein the plurality of gate layers and the plurality of insulating layers filled in the plurality of first horizontal openings are alternately stacked to from a gate stack structure; and forming a plurality of charge storage layers between the plurality of gate layers and the plurality of channel rings, respectively.

According to an embodiment of the disclosure, the plurality of first intermediate layers, the plurality of second intermediate layers, and the protection pillar include different materials.

According to an embodiment of the disclosure, the plurality of first intermediate layers include a semiconductor material, and the plurality of second intermediate layers and the protection pillar include dielectric materials.

According to an embodiment of the disclosure, the plurality of first intermediate layers include undoped polysilicon, the plurality of second intermediate layers include silicon nitride, and the protection pillar includes silicon oxide.

According to an embodiment of the disclosure, forming the plurality of insulating layers in the plurality of first horizontal openings and the plurality of ring spaces includes forming interfaces, slits or voids within the plurality of insulating layers.

According to an embodiment of the disclosure, removing the plurality of first intermediate layers includes using alkaline solution.

A method of forming a 3D AND flash memory device of the disclosure can be integrated with the existing process, in which a channel pillar penetrating through the gate stack structure is cut into a plurality of channel rings. These channel rings are physically separated from each other with insulating layers. This helps the gate layer to control the channel regions, so as to reduce leakage current, increase the device window, and increase the current ratio between on and off ($I_{on}/I_{off}$).

DESCRIPTION OF THE EMBODIMENTS

Figure 1A:
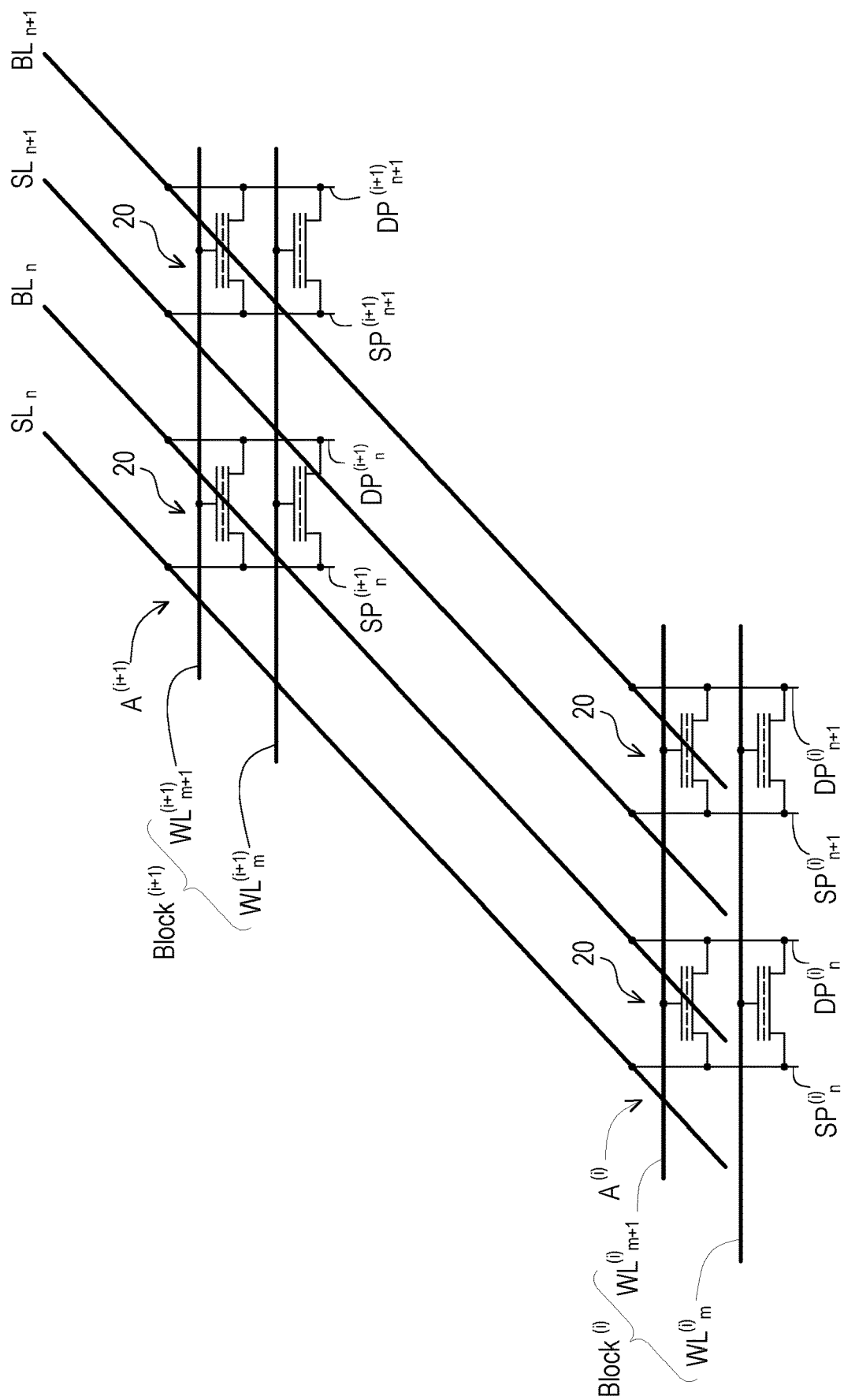
FIG. 1A shows a circuit diagram of a 3D AND flash memory array according to some embodiments in according to the present disclosure.
Figure 1B:
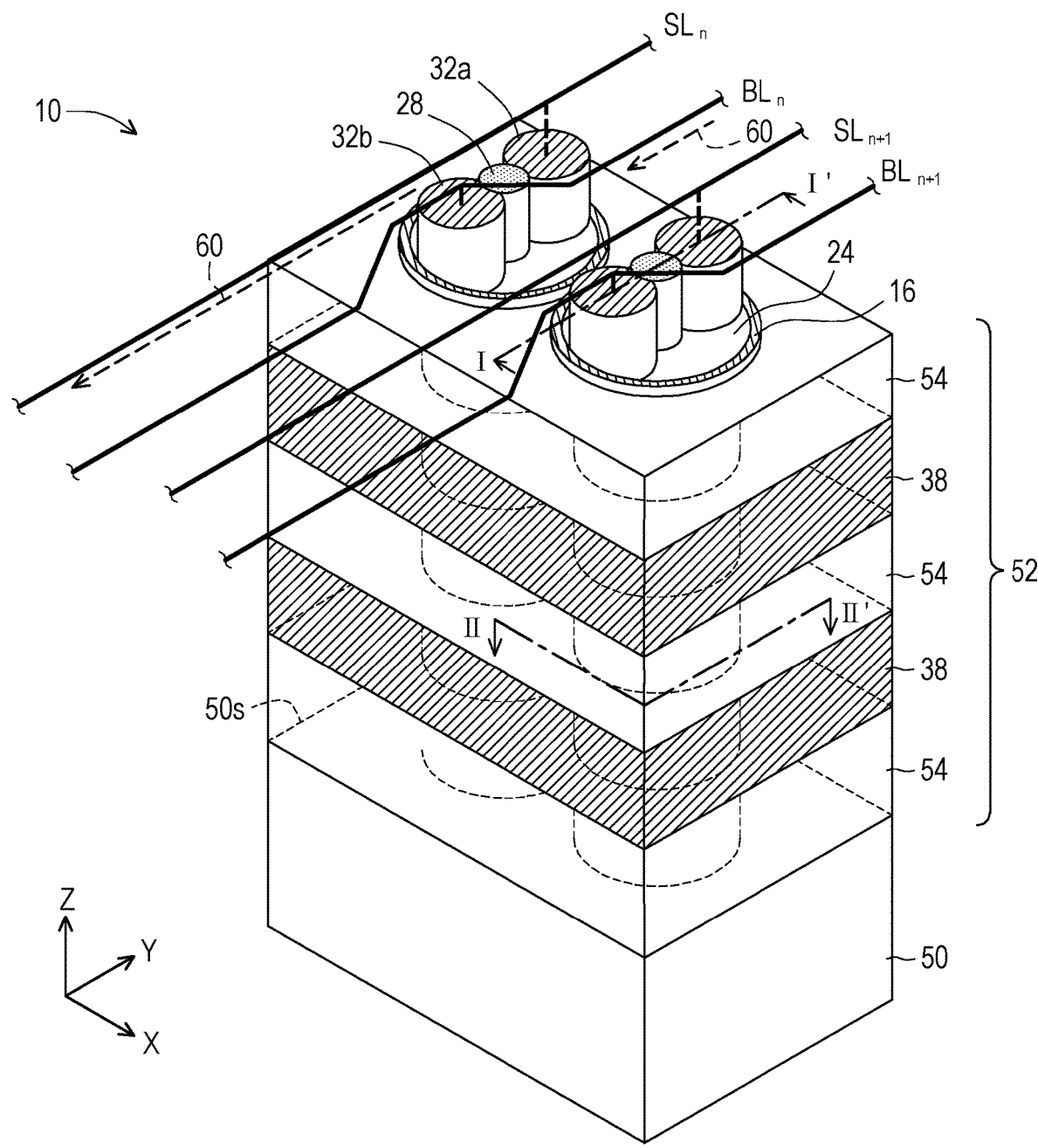
FIG. 1B shows a partial simplified perspective view of the memory array in FIG. 1A.
Figure 1C:
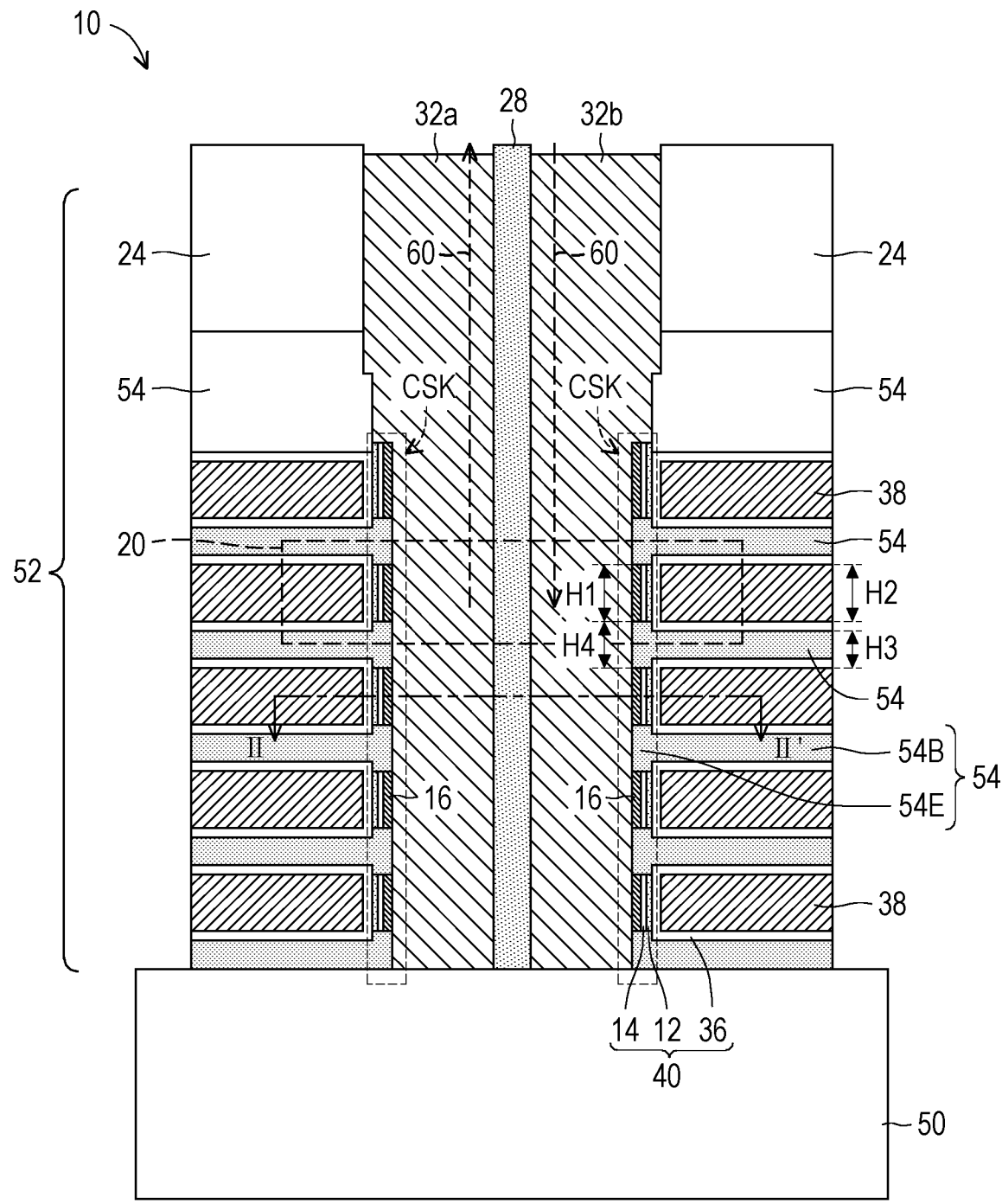
FIG. 1C and FIG. 1D show cross-sectional views taken along line I-I' of FIG. 1B.
Figure 1D:
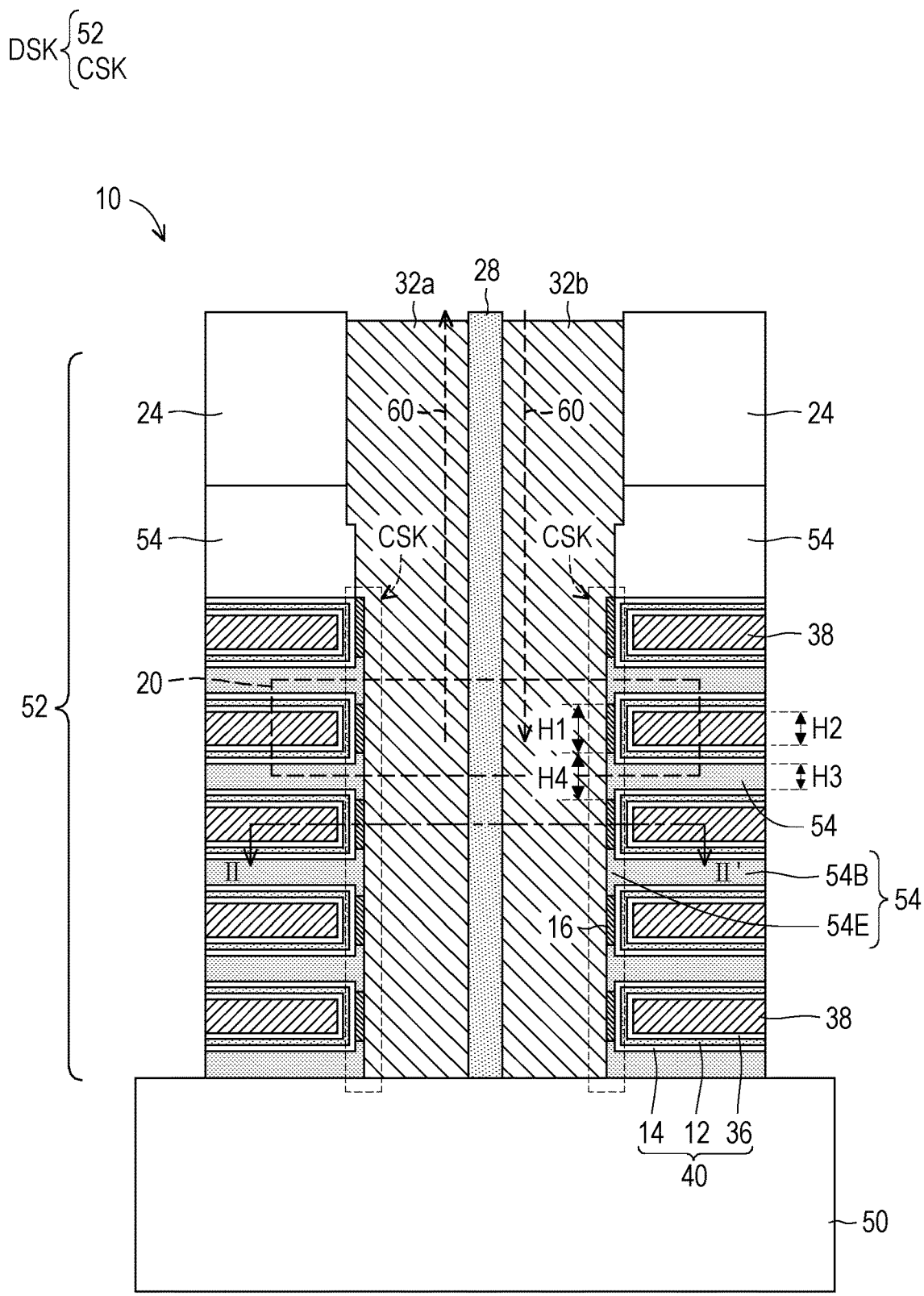
Figure 1E:
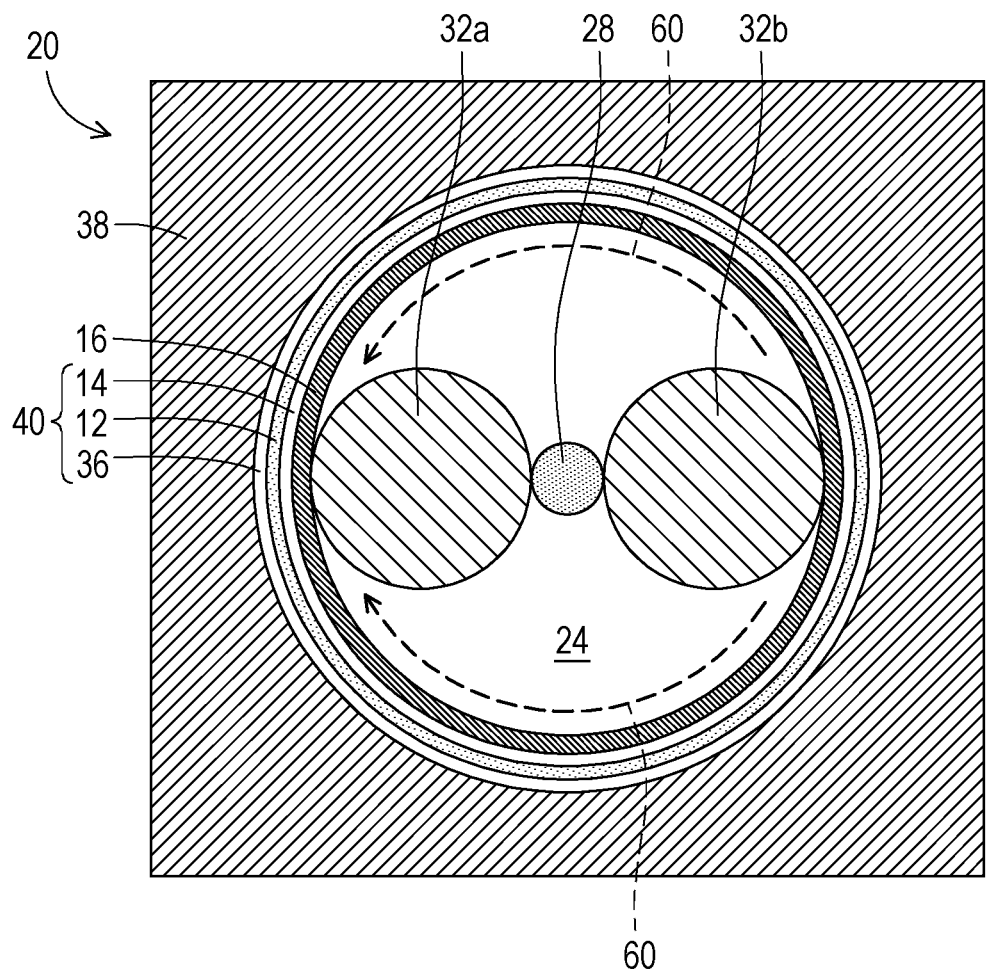
FIG. 1E shows a top view of line II-II' of FIG. 1C and FIG. 1D.

FIG. 1A shows a circuit diagram of a 3D AND flash memory array according to some embodiments in according to the present disclosure. FIG. 1B shows a partial simplified perspective view of the memory array in FIG. 1A. FIG. 1C and FIG. 1D show cross-sectional views taken along line I-I' of FIG. 1B. FIG. 1E shows a top view of line II-II' of FIG. 1C and FIG. 1D.

FIG. 1A shows a schematic view of two blocks $BLOCK^{(i)}$ and $BLOCK^{(i+1)}$ of a vertical AND memory array 10 arranged in rows and columns. The block $BLOCK^{(i)}$ includes a memory array $A^{(i)}$. A row (e.g., an $(m+1)^{th}$ row) of the memory array $A^{(i)}$ is a set of AND memory cells 20 having a common word line (e.g., $WL^{(i)}_{m+1}$). The AND memory cells 20 of the memory array $A^{(i)}$ in each row (e.g., the $(m+1)^{th}$ row) correspond to a common word line (e.g., $WL^{(i)}_{m+1}$) and are coupled to different source pillars (e.g., $SP^{(i)}_n$ and $SP^{(i)}_{n+1}$) and drain pillars (e.g., $DP^{(i)}_n$ and $DP^{(i)}_{n+1}$), so that the AND memory cells 20 are logically arranged in a row along the common word line (e.g., $WL^{(i)}_{m+1}$).

A column (e.g., an $n^{th}$ column) of the memory array $A^{(i)}$ is a set of AND memory cells 20 having a common source pillar (e.g., $SP^{(i)}_n$) and a common drain pillar (e.g., $DP^{(i)}_n$). The AND memory cells 20 of the memory array $A^{(i)}$ in each column (e.g., the $n^{th}$ column) correspond to different word lines (e.g., $WL^{(i)}_{m+1}$ and $WL^{(i)}_m$) and are coupled to a common source pillar (e.g., $SP^{(i)}_n$) and a common drain pillar (e.g., $DP^{(i)}_n$). Hence, the AND memory cells 20 of the memory array $A^{(i)}$ are logically arranged in a column along the common source pillar (e.g., $SP^{(i)}_n$) and the common drain pillar (e.g., $DP^{(i)}_n$). In the physical layout, according to the fabrication method as applied, the columns or rows may be twisted and arranged in a honeycomb pattern or other patterns for high density or other reasons.

In FIG. 1A, in the block $BLOCK^{(i)}$, the AND memory cells 20 in the $n^{th}$ column of the memory array $A^{(i)}$ share a common source pillar (e.g., $SP^{(i)}_n$) and a common drain pillar (e.g., $DP^{(i)}_n$). The AND memory cells 20 in an $(n+1)^{th}$ column share a common source pillar (e.g., $SP^{(i)}_{n+1}$) and a common drain pillar (e.g., $DP^{(i)}_{n+1}$).

The common source pillar (e.g., $SP^{(i)}_n$) is coupled to a common source line (e.g., $SL_n$) and the common drain pillar (e.g., $DP^{(i)}_n$) is coupled to a common bit line (e.g., $BL_n$). The common source pillar (e.g., $SP^{(i)}_{n+1}$) is coupled to a common source line (e.g., $SL_{n+1}$) and the common drain pillar (e.g., $DP^{(i)}_{n+1}$) is coupled to a common bit line (e.g., $BL_{n+1}$).

Likewise, the block $BLOCK^{(i)}$ includes a memory array $A^{(i+1)}$, which is similar to the memory array $A^{(i)}$ in the block $BLOCK^{(i)}$. A row (e.g., an $(m+1)^{th}$ row) of the memory array $A^{(i)}$ is a set of AND memory cells 20 having a common word line (e.g., $WL^{(i+1)}_{m+1}$). The AND memory cells 20 of the memory array $A^{(i)}$ in each row (e.g., the $(m+1)^{th}$ row) correspond to a common word line (e.g., $WL^{(i+1)}_{m+1}$) and are coupled to different source pillars (e.g., $SP^{(i+1)}_n$ and $SP^{(i)}_{n+1}$) and drain pillars (e.g., $DP^{(i)}_n$ and $DP^{(i)}_{n+1}$). A column (e.g., an $n^{th}$ column) of the memory array $A^{(i)}$ is a set of AND memory cells 20 having a common source pillar (e.g., $SP^{(i)}_n$) and a common drain pillar (e.g., $DP^{(i+1)}_n$). The AND memory cells 20 of the memory array $A^{(i+1)}$ in each column (e.g., the $n^{th}$ column) correspond to different word lines (e.g., $WL^{(i+1)}_{m+1}$ and $WL^{(i+1)}_m$) and are coupled to a common source pillar (e.g., $SP^{(i+1)}_n$) and a common drain pillar (e.g., $DP^{(i+1)}_n$). Hence, the AND memory cells 20 of the memory array $A^{(i+1)}$ are logically arranged in a column along the common source pillar (e.g., $SP^{(i+1)}_n$) and the common drain pillar (e.g., $DP^{(i)}_n$).

The block $BLOCK^{(i+1)}$ and the block $BLOCK^{(i)}$ share source lines (e.g., $SL_n$ and $SL_{n+1}$) and bit lines (e.g., $BL_n$ and $BL_{n+1}$). Therefore, the source line $SL_n$ and the bit line $BL_n$ are coupled to the $n^{th}$ column of AND memory cells 20 in the AND memory array $A^{(i)}$ of the block $BLOCK^{(i)}$, and are coupled to the $n^{th}$ column of AND memory cells 20 in the AND memory array $A^{(i+1)}$ of the block $BLOCK^{(i+1)}$. Similarly, the source line $SL_{n+1}$ and the bit line $BL_{n+1}$ are coupled to the $(n+1)^{th}$ column of AND memory cells 20 in the AND memory array $A^{(i)}$ of the block $BLOCK^{(i)}$, and are coupled to the $(n+1)^{th}$ column of AND memory cells 20 in the AND memory array $A^{(i+1)}$ of the block $BLOCK^{(i+1)}$.

Referring to FIG. 1B and FIG. 1D, the memory array 10 may be disposed over an interconnect structure of a semiconductor die, for example, being disposed on one or more active devices (e.g., transistors) formed on a semiconductor substrate. Therefore, the dielectric substrate 50 is, for example, a dielectric layer (e.g., a silicon oxide layer) over a conductive interconnect structure formed on a silicon substrate. The memory array 10 may include a gate stack structure 52, a plurality of channel rings 16, a plurality of first conductive pillars (also referred to as source pillars) 32a, a plurality of second conductive pillars (also referred to as drain pillars) 32b, and a plurality of charge storage structures 40.

Referring to FIG. 1B, the gate stack structure 52 is formed on the dielectric substrate 50 in the array region (not shown) and the staircase region (not shown). The gate stack structure 52 includes a plurality of gate layers (also referred to as word lines) 38 and a plurality of insulating layer 54 vertically stacked on a surface 50s of the dielectric substrate 50. In a direction Z, the gate layers 38 are electrically isolated from each other by the insulating layer 54 disposed therebetween. The gate layers 38 extend in a direction parallel to the surface 50s of the dielectric substrate 50. The gate layers 38 in the staircase region may have a staircase structure (not shown). Therefore, a lower gate layer 38 is longer than an upper gate layer 38, and the end of the lower gate layer 38 extends laterally beyond the end of the upper gate layer 38. A contact (not shown) for connecting the gate layer 38 may land on the end of the gate layer 38 to connect the gate layers 38 respectively to conductive lines.

Referring to FIG. 1B to FIG. 1D, the memory array 10 further includes a plurality of channel rings 16 stacked along a direction Z. In some embodiments, each of the channel rings 16 has an annular shape from a top view. The material of the channel rings include a semiconductor material, such as undoped polysilicon.

Referring to FIG. 1B to FIG. 1D, the memory array 10 further includes an insulating pillar 28, a plurality of first conductive pillars 32a, and a plurality of second conductive pillars 32b. In this example, the first conductive pillars 32a serve as source pillars. The second conductive pillars 32b serve as drain pillars. The first conductive pillar 32a, the second conductive pillar 32b and the insulating pillar 28 are each extend in a direction (i.e., the direction Z) perpendicular to the gate layer 38. The first conductive pillar 32a and the second conductive pillar 32b are separated from each other by the insulating pillar 28. The first conductive pillar 32a and the second conductive pillar 32b are electrically connected to the channel rings 16. The first conductive pillar 32a and the second conductive pillar 32b include doped polysilicon or metal materials. The insulating pillar 28 is, for example, silicon nitride.

Referring to FIG. 1C and FIG. 1D, the charge storage structures 40 are disposed between the channel rings 16 and the gate layers 38. Each of the charge storage structure 40 may include a tunneling layer (or referred to as a bandgap engineered tunneling oxide layer) 14, a charge storage layer 12, and a blocking layer 36. The charge storage layer 12 is located between the tunneling layer 14 and the blocking layer 36. In some embodiments, the tunneling layer 14 and the blocking layer 36 include silicon oxide. The charge storage layer 12 includes silicon nitride or other materials capable of trapping charges. In some embodiments, as shown in FIG. 1C, a portion (the tunneling layer 14 and the charge storage layer 12) of the charge storage structure 40 continuously extends in a direction (i.e., the direction Z) perpendicular to the gate layer 38, and the other portion (the blocking layer 36) of the charge storage structure 40 surrounds the gate layer 38. In other embodiments, as shown in FIG. 1D, the charge storage structure 40 (the tunneling layer 14, the charge storage layer 12, and the blocking layer 36) surrounds the gate layer 38.

Referring to FIG. 1E, a charge storage structure 40, a channel ring 16, a source pillar 32a, and a drain pillar 32b are surrounded by a gate layer 38, and a memory cell 20 is defined. According to different operation methods, a 1-bit operation or a 2-bit operation may be performed on the memory cell 20. For example, when a voltage is applied to the source pillar 32a and the drain pillar 32b, since the source pillar 32a and the drain pillar 32b are connected to the channel ring 16, electrons may be transferred along the channel ring 16 and stored in the entire charge storage structure 40. Accordingly, a 1-bit operation may be performed on the memory cell 20. In addition, for an operation involving Fowler-Nordheim tunneling, electrons or holes may be trapped in the charge storage structure 40 between the source pillar 32a and the drain pillar 32b. For an operation involving source side injection, channel-hot-electron injection, or band-to-band tunneling hot carrier injection, electrons or holes may be locally trapped in the charge storage structure 40 adjacent to one of the source pillar 32a and the drain pillar 32b. Accordingly, a single level cell (SLC, 1 bit) or multi-level cell (MLC, greater than or equal to 2 bits) operation may be performed on the memory cell 20.

During operation, a voltage is applied to a selected word line (gate layer) 38; for example, when a voltage higher than a corresponding threshold voltage ($V_{th}$) of the corresponding memory cell 20 is applied, the channel ring 16 intersecting the selected word line 38 is turned on to allow a current to enter the drain pillar 32b from the bit line $BL_n$ or $BL_{n+1}$ (shown in FIG. 1B), flow to the source pillar 32a via the turned-on channel region (e.g., in a direction indicated by arrow 60), and finally flow to the source line $SL_n$ or $SL_{n+1}$ (shown in FIG. 1B).

Referring to FIG. 1C and FIG. 1D, in an embodiment of the disclosure, the insulating layer 54 is a continuous layer between the plurality of gate layers 38 and between the plurality of channel rings 16. The insulating layers 54, the channel rings 16 and the gate layers 38 form a composite stack structure (or referred to as a double stack structure) DSK. The composite stack structure DSK includes a gate stack structure 52 and a channel stack structure CSK. In other words, the insulting layers 54 include a plurality of body portions 54B and a plurality of extending portions 54E. The body portions 54B and the gate layers 38 are alternately stacked to form a gate stack structure 52. The extending portions 54E are connected to the body portions 54B, the extending portions 54E and the channel rings 16 are alternately stacked to form a channel stack structure CSK. The channel stack structure CSK penetrates through the gate stack structure 52.

From a side view, the channel rings 16 of the channel stack structure CSK discontinuously penetrate through the gate stack structure 52, and two adjacent channel rings 16 are isolated from each other by the extending portion 54E of the insulting layer 54. The height H4 of the extending portion 54E may be equal to, less than or greater than the height H3 of the body portions 54B, so that the height H1 of the channel rings 16 may be equal to, less than or greater than the height H2 of the gate layer 38. The height H1 is the channel width, and the height H2 is the gate width. When the gate width is greater than the channel width (i.e., the height H2 is greater than the height H1), the gate control ability is better, the sub-threshold swing is smaller, and the cell distribution is tighter. When the gate width is smaller than the channel width (i.e., the height H2 is smaller than the height H1), the on-current increases and the operation (read/write) speed increases.

FIG. 2A to FIG. 2L are schematic cross-sectional views of a process of fabricating a 3D AND flash memory device according to an embodiment of the disclosure.

Figure 2A:
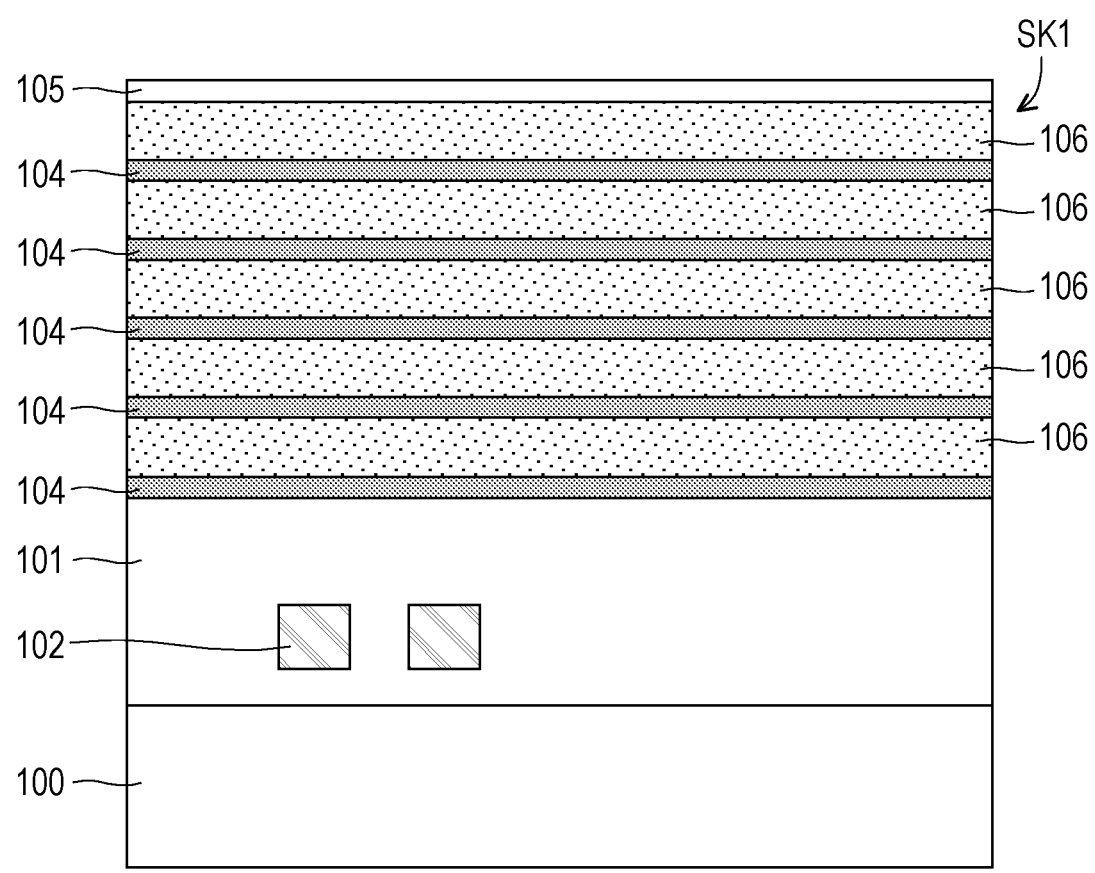
FIG. 2A to FIG. 2L show cross-sectional views of a manufacturing process of a 3D AND flash memory device in according to an embodiment of the present disclosure.

Referring to FIG. 2A, a dielectric substrate 100 is provided. The dielectric substrate 100 is, for example, a dielectric layer (e.g., a silicon oxide layer) over a metal interconnect structure formed on a silicon substrate. The dielectric substrate 100 includes an array region and a staircase region. A stack structure SK1 is formed on the dielectric substrate 100 in the array region and the staircase region. The stack structure SK1 may also be referred to as an insulating stack structure SK1. In this embodiment, the stack structure SK1 is composed of intermediate layers 104 and intermediate layers 106 that are sequentially alternately stacked on the dielectric substrate 100. In other embodiments, the stack structure SK1 may be composed of intermediate layers 106 and intermediate layers 104 that are sequentially alternately stacked on the dielectric substrate 100. In addition, in this embodiment, the uppermost layer of the stack structure SK1 is the insulating layer 104. The intermediate layers 104 and 106 may serve as sacrificial layers which may be partially removed in the subsequent process. In this embodiment, the stack structure SK1 has five intermediate layers 104 and five intermediate layers 106, but the disclosure is not limited thereto. In other embodiments, more intermediate layers 104 and more intermediate layers 106 may be formed according to the actual requirements.

A stop layer 105 is formed on the stacked structure SK1. The stop layer 105 and the intermediate layers 106 include dielectric materials, and the intermediate layers 104 include semiconductor materials. The stop layer 105 includes silicon oxide, the intermediate layers 106 include silicon nitride, and the intermediate layers 104 includes polysilicon.

In some embodiments, before the stack structure SK1 is formed, an insulating layer 101 and a stop layer 102. The insulating layer 101 is, for example, silicon oxide. The stop layer 102 is formed in the insulating layer 101. The stop layer 102 is, for example, a conductive pattern such as a polysilicon pattern. The stack structure SK1 is patterned to form a staircase structure in the staircase region.

Figure 2B:
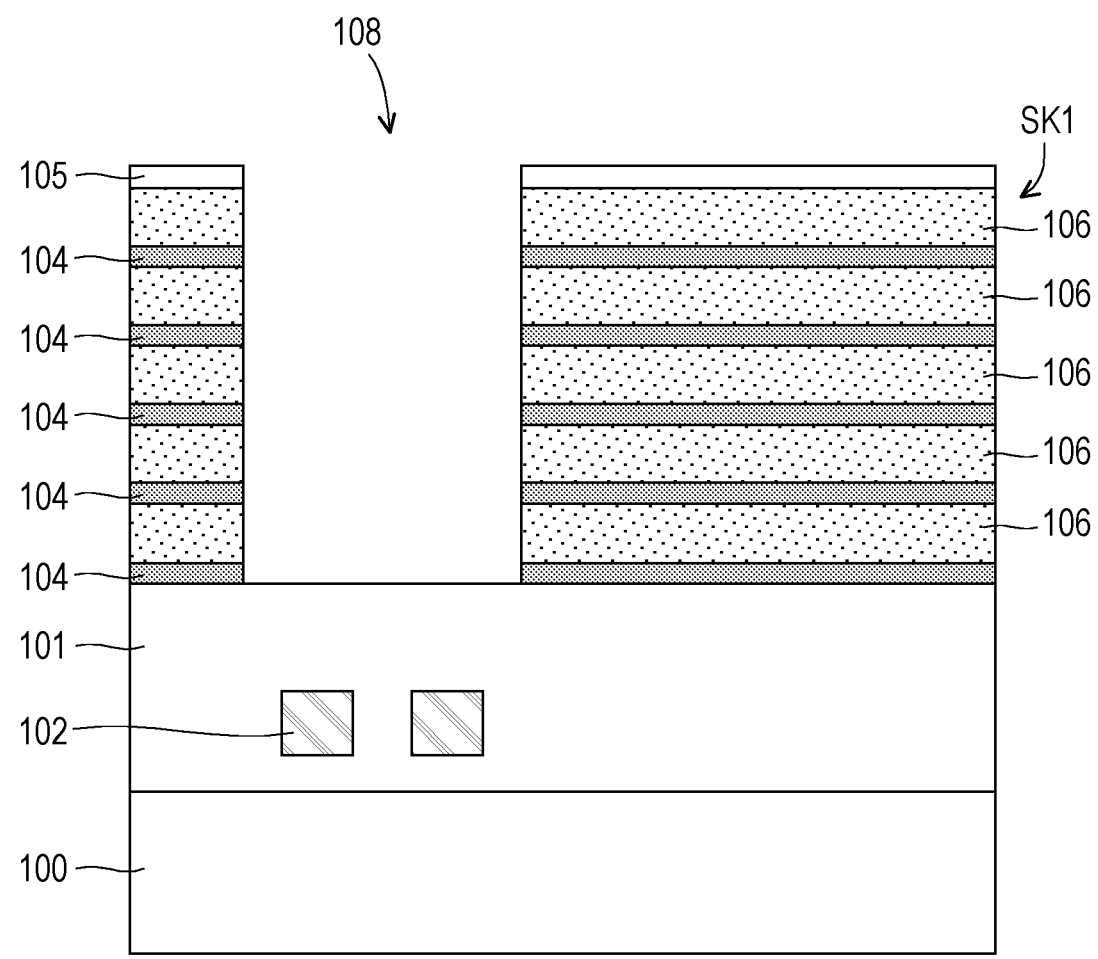

Next, referring to FIG. 2B, a plurality of openings 108 are formed in the stack structure SK1 in the array region. In this embodiment, the opening 108 extends through the stack structure SK1, and the bottom surface of the opening 108 does not expose the stop layer 102, but the disclosure is not limited thereto. In this embodiment, in a top view, the opening 108 has a circular profile, but the disclosure is not limited thereto. In other embodiments, the opening 108 may have a profile of other shapes such as a polygonal shape (not shown).

Figure 2C:
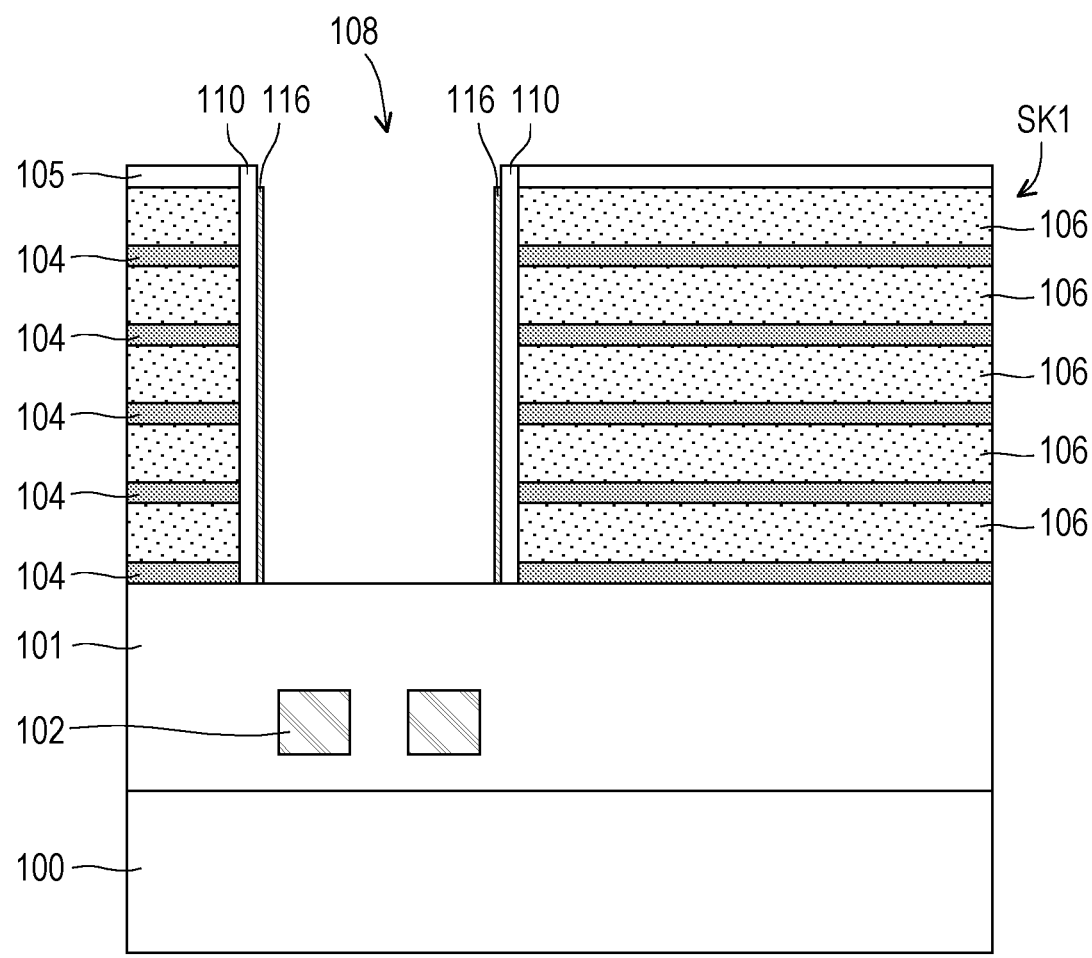

Referring to FIG. 2C, a protection pillar 110 and a channel pillar 116 are formed in the opening 108. The protection pillar 110 is formed on the sidewall of the intermediate layers 106 of stack structure SK1 exposed by the opening 108. The protection pillar 110 is, for example, a silicon oxide layer. The material of the channel pillar 116 may be semiconductor such as undoped polysilicon. The method of forming the protection pillar 110 is, for example, thermal oxidation. The method of forming the channel pillar 116 and the protection pillar 110 includes, for example, forming a channel material layer and a protection material layer on the stack structure SK1 and in the opening 108. Then, an etch-back process is performed to partially remove the channel material layer and the spacer material layer to form the channel pillar 116 and the protection pillar 110. The channel pillar 116 and the protection pillar 110 cover the sidewall of the opening 108 and expose the bottom of the opening 108. The channel pillar 116 and the spacer 117 may extend through the stack structure SK1 and extend into the insulating layer 101 but are not limited thereto. In a top view, the channel pillar 116 has, for example, a ring shape, and the channel pillar 116 may be continuous in its extending direction (e.g., in a direction perpendicular to the dielectric substrate 100). In other words, the channel pillar 116 is integral in its extending direction and is not divided into multiple disconnected parts. In some embodiments, the channel pillar 116 may have a circular profile in a top view, but the disclosure is not limited thereto. In other embodiments, the channel pillar 116 may also have a profile of other shapes (e.g., a polygonal shape) in a top view.

Figure 2D:
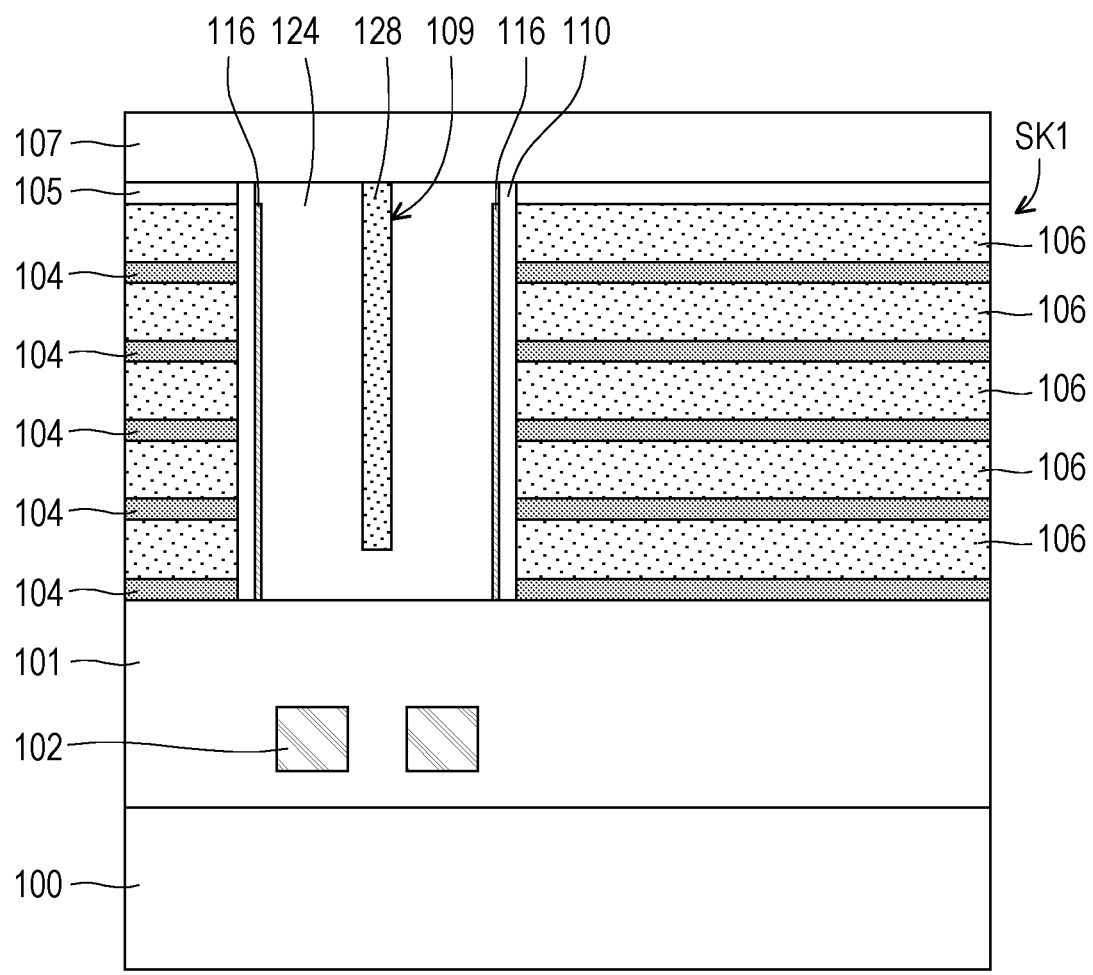

Referring to FIG. 2D, an insulating filling material is formed on the stack structure SK1 and filled in the opening 108. The insulating filling material is, for example, a low-temperature silicon oxide. The insulating filling material filled in the opening 108 forms an insulating filling layer 124, and a circular seam is left at the center of the insulating filling layer 124. Then, an anisotropic etching process is performed to expand the circular seam to form a hole 109.

Referring to FIG. 2D, an insulating material layer is formed on the insulating filling layer 124 and in the hole 109. Then, an anisotropic etching process is performed to remove part of the insulating material layer to form an insulating pillar 128 in the hole 109. The material of the insulating pillar 128 is different from the material of the insulating filling layer 124. The material of the insulating pillar 128 is, for example, silicon nitride. Thereafter, an insulating layer 107 is formed on the stop layer 105, the filling layer 124 and the insulating pillar 128. The material of the insulating layer 107 is, for example, silicon oxide.

Figure 2E:
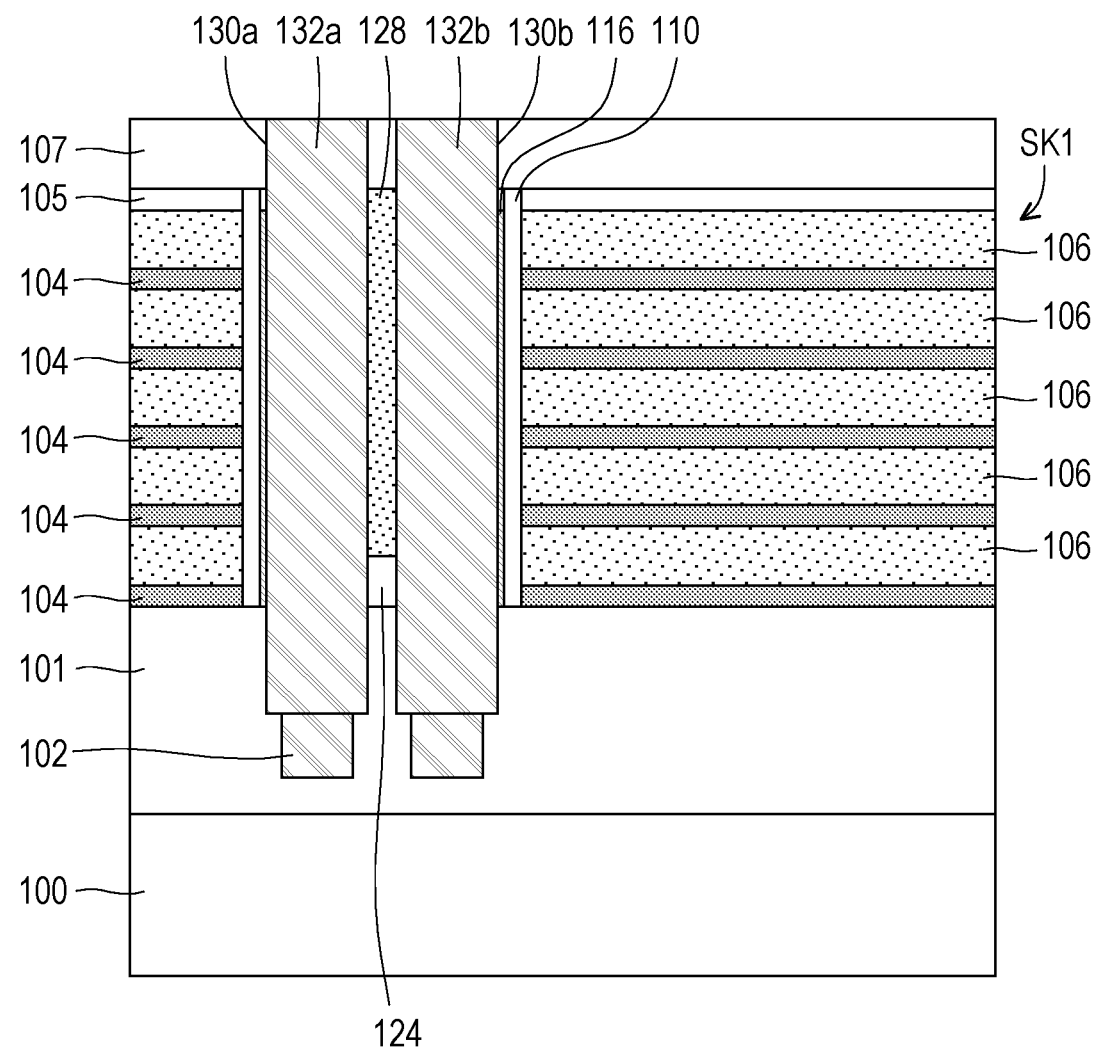

Referring to FIG. 2E, a patterning process (e.g., photolithography and etching processes) is performed to form holes 130a and 130b in the insulating layer 107 and the insulating filling layer 124. In the etching process, the stop layer 102 may serve as an etch stop layer. Therefore, the formed holes 130a and 130b penetrate through the stack structure SK1 and extend to expose the stop layer 102. The profiles of the hole patterns defined in the patterning process may be tangent to the profile of the insulating pillar 128. The profiles of the hole patterns defined in the patterning process may also exceed the profile of the insulating pillar 128. Since the etching rate of the insulating pillar 128 is lower than the etching rate of the insulating filling layer 124, the insulating pillar 128 is hardly damaged by etching and remains. In addition, in some embodiments, the profiles of the hole patterns defined in the patterning process exceed the profile of the opening 108, so that the upper sidewalls of the holes 130a and 130b expose part of the stop layer 105 on the stack structure SK1. The middle sidewalls and the lower sidewalls of the holes 130a and 130b expose the insulating layer 101, the insulating pillar 128, and the spacer 117.

Referring to FIG. 2E, conductive pillars 132a and 132b are formed in the holes 130a and 130b. The conductive pillars 132a and 132b can serve as source and drain pillars, respectively, and are electrically connected to the channel pillar 116. The method of forming the conductive pillars 132a and 132b includes forming a conductive material on the insulating layer 107 filling in the holes 130a and 130b, and performing an etch-back process. The material of the conductive pillars 132a and 132b include doped polysilicon.

Figure 2F:
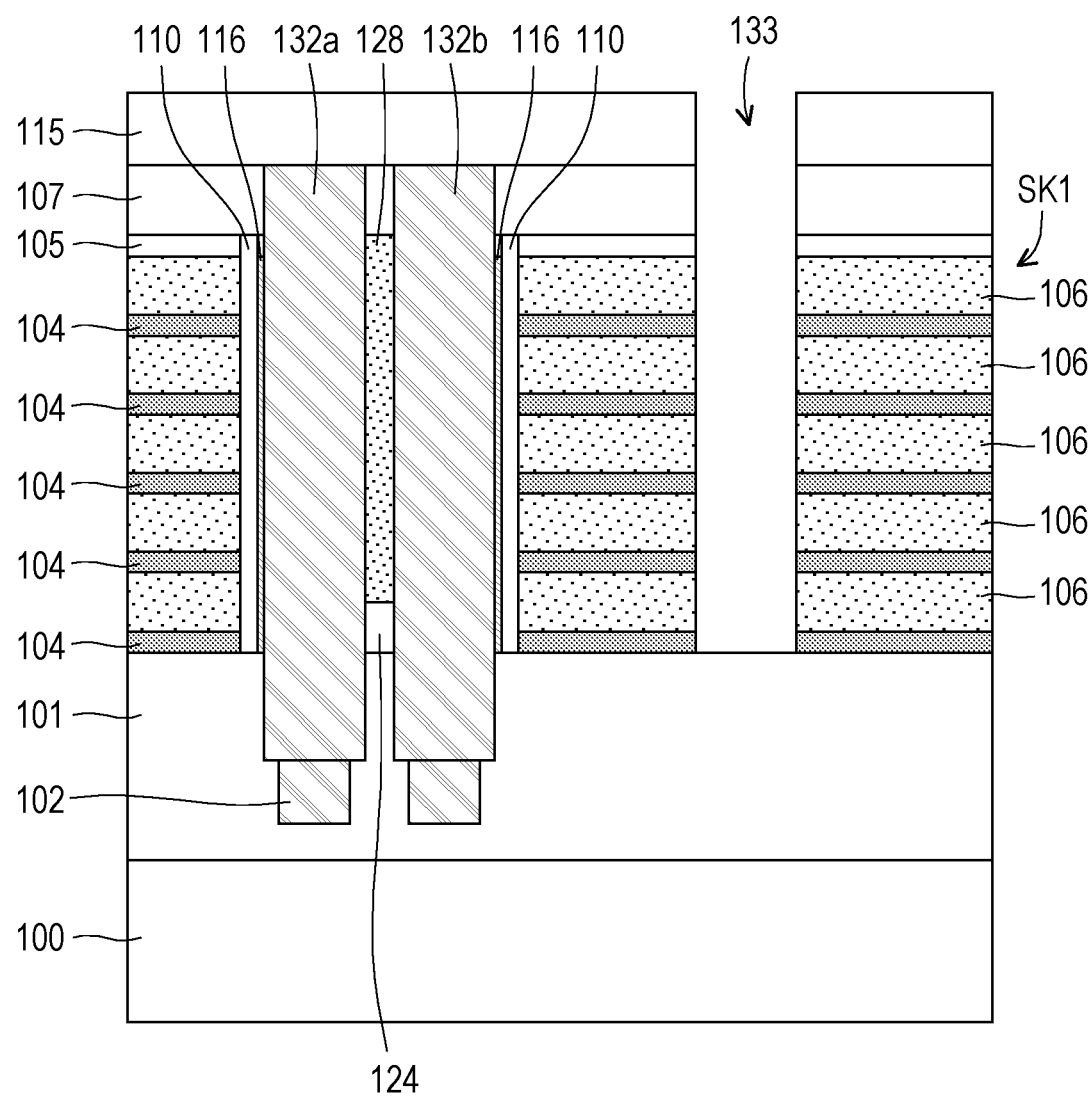
Figure 2G:
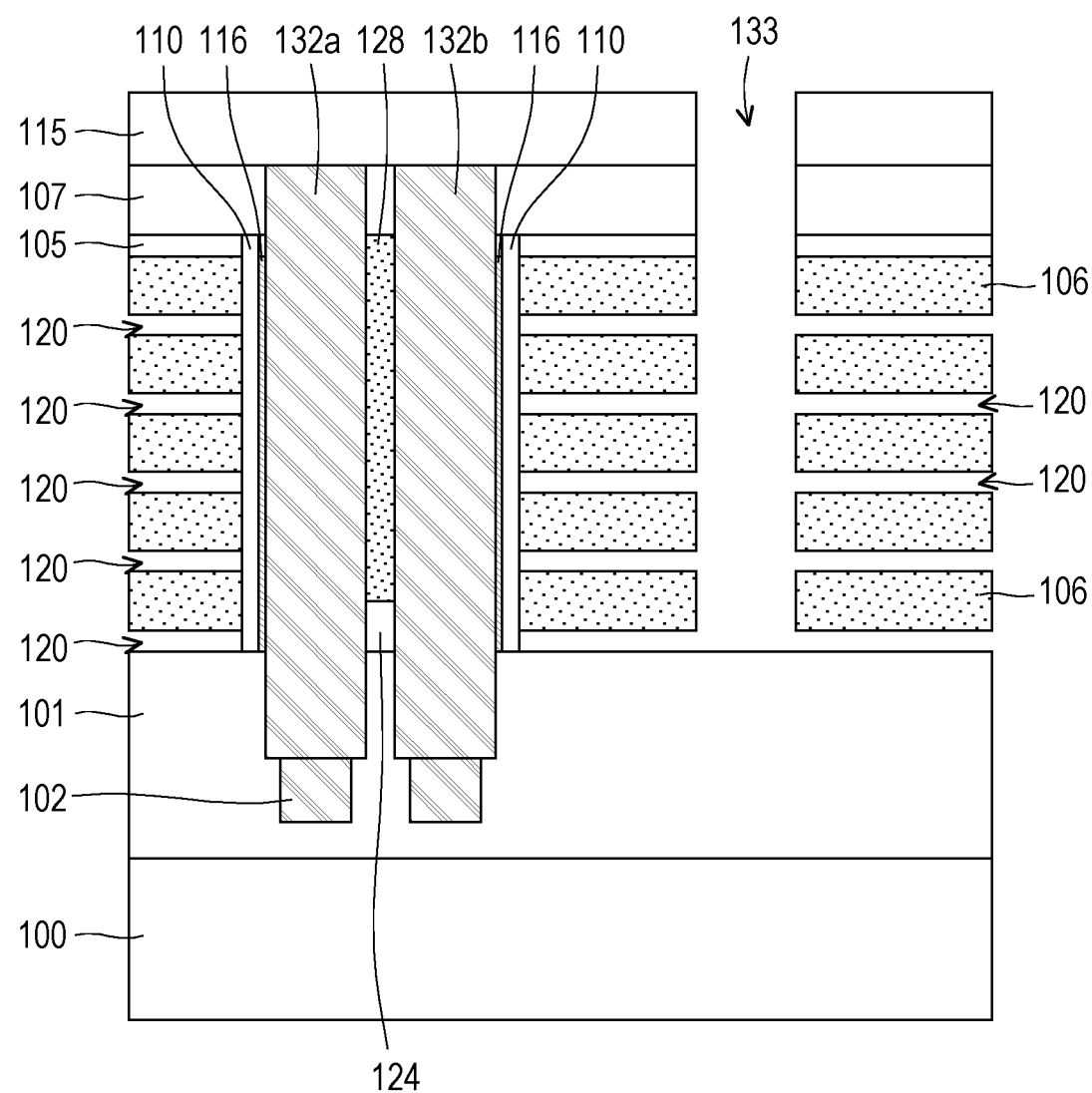

Referring to FIG. 2F, a cap insulating layer 115 is formed on the insulating layer 107 and the conductive pillars 132a and 132b. The material of the cap insulating layer 115 is, for example, silicon oxide. Afterwards, a patterning process (e.g., photolithography and etching processes) is performed on the stack structure SK1 to form a plurality of slit trenches 133. In the etching process, the insulating layer 101 may serve as an etch stop layer, so that the slit trench 133 exposes the insulating layer 101. The slit trench 133 extends along the X direction, so that the stack structure SK1 in the array region and the staircase region is divided into a plurality of blocks (not shown).

Next, an etching process such as a wet etching process is performed to remove part of the intermediate layers 104. An etching solution (e.g., hot phosphoric acid) used in the etching process is injected into the slit trench 133, and then the intermediate layers 104 exposed by the slit trench 133 are removed. The etching process is performed, with time mode control, to remove most of the intermediate layers 104, so as to form a plurality of horizontal openings 120. The etching solution includes using an alkaline etching solution, such as an amine hydroxide solution, a TMAH solution, or a potassium hydroxide solution. The alkaline etching solution has a relatively high etching selectivity for silicon oxide and silicon nitride. The etching rate of the etching process is, for example, 500 angstroms/minute to 1000 angstroms/minute.

Figure 2H:
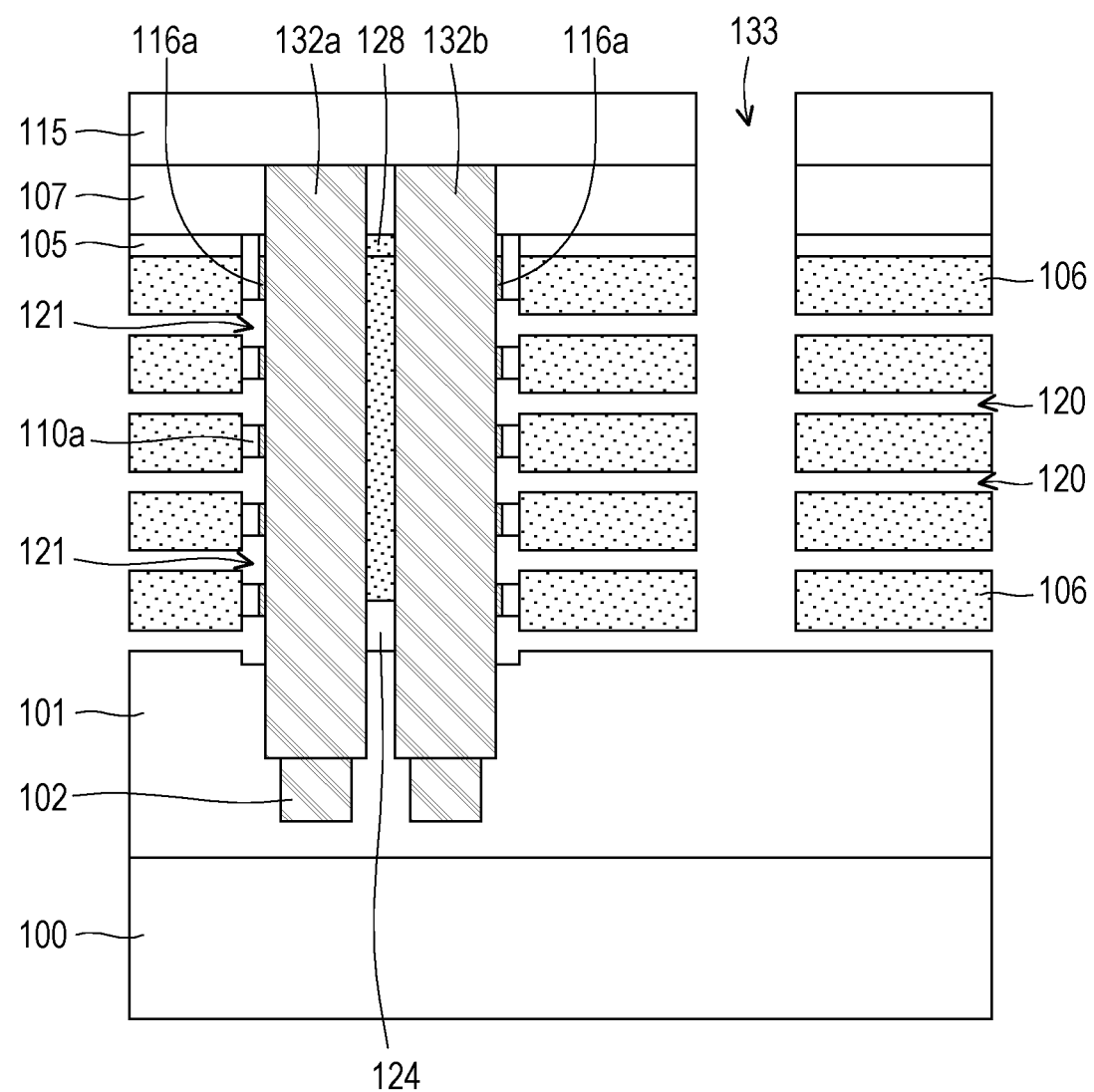

Referring to FIG. 2H, a cutting process is performed to the channel pillar 116. An etching process is performed to remove a portion of the protection pillar 110 exposed by the horizontal openings 120 and cut the pillar layer 116, so as to form plurality of ring spaces 121, a plurality of protection rings 110a and a plurality of channel rings 116a, and the plurality of protection rings 110a and the plurality of channel rings 116a are separated by the plurality of ring spaces 121. The ring spaces 121 expose conductive pillars 132a and 132b and the insulting filling layer 124. The etching process includes a first stage etching process for removing the portion of the protection pillar 110, and a second stage etching process for cutting the pillar layer 116. The etching solution used in the first stage etching process includes an acidic etching solution, such as hydrofluoric acid solution or other suitable etching solution. The acidic etching solution has a relatively high etching selectivity for silicon oxide and silicon nitride. The etching rate of the second stage etching process is, for example, 3 angstroms/minute to 30 angstroms/minute. The etching solution used in the second stage etching process is, for example, SC1, which has a lower etching rate to more accurately control the etching process. The etching rate of the second stage etching process is, for example, 1 angstroms/minute to 10 angstroms/minute.

Figure 2I:
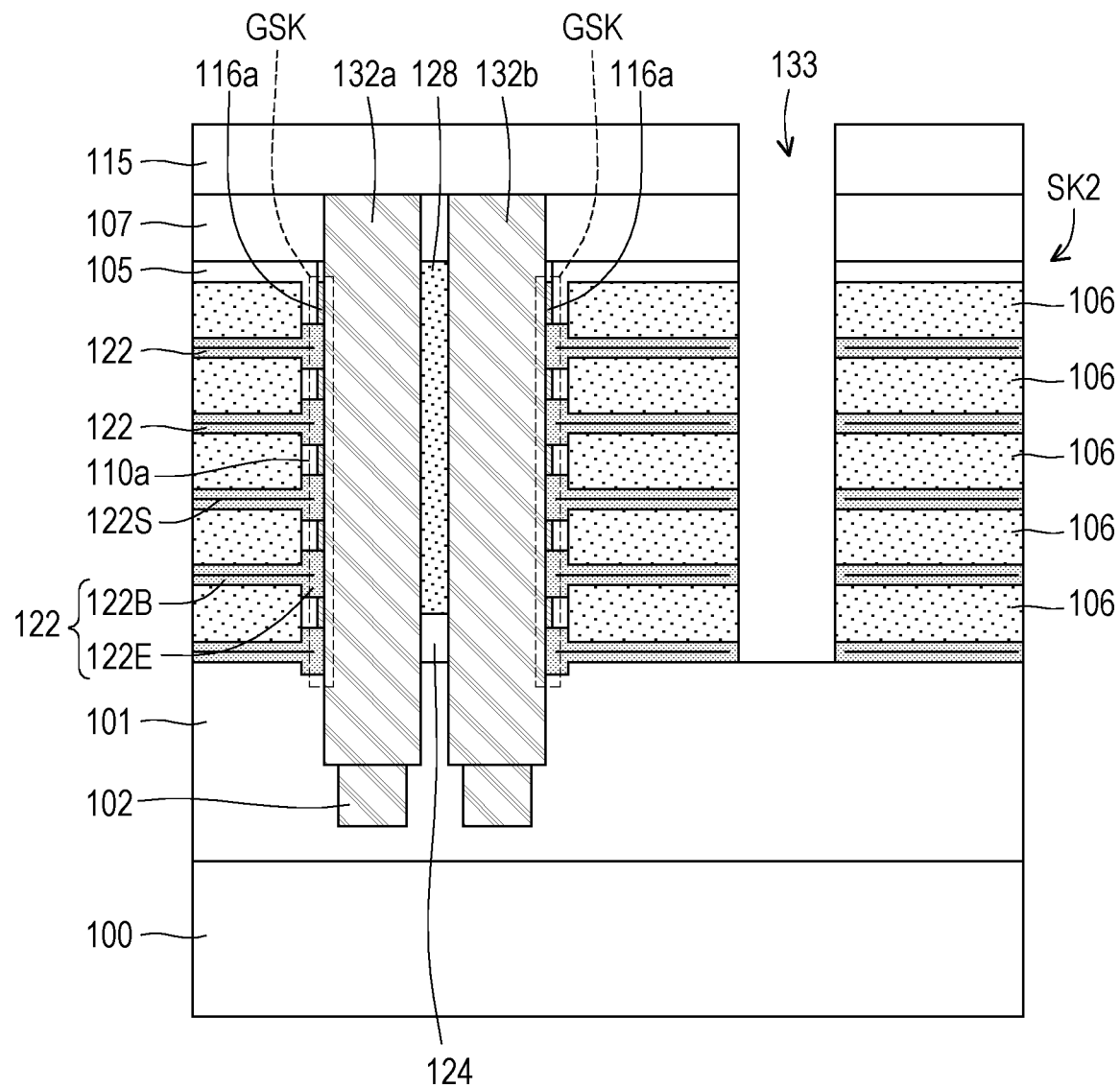

Referring to FIG. 2I, a plurality of insulating layers 122 are filled back to the plurality of horizontal openings 120 and the plurality of ring spaces 121. The method of forming the insulating layers 122 includes the following steps. An insulating material is filled back to the slit trench 133, the horizontal openings 120 and the ring spaces 121. An etch-back process is then performed to remove the insulating material in the slit trench 133 to expose sidewalls of the intermediate layers 106. The insulating layers 122 include body portions 122B and extending portions 122E connected to each other. The body portions 122B are disposed in the horizontal openings 120. The body portions 122B and the intermediate layers 106 are alternately stacked on each other. The extending portions 122E are disposed in the ring spaces 121 and connected to the body portions 122B. The extending portions 122E and the channel rings 116a are alternately stacked to from a channel stack structure CSK. In some embodiments, since the insulating layers 122 are filled back to the horizontal openings 120 and the ring spaces 121, so the insulating layers 122 have interfaces, slits and voids 122S formed therein.

Figure 2J:
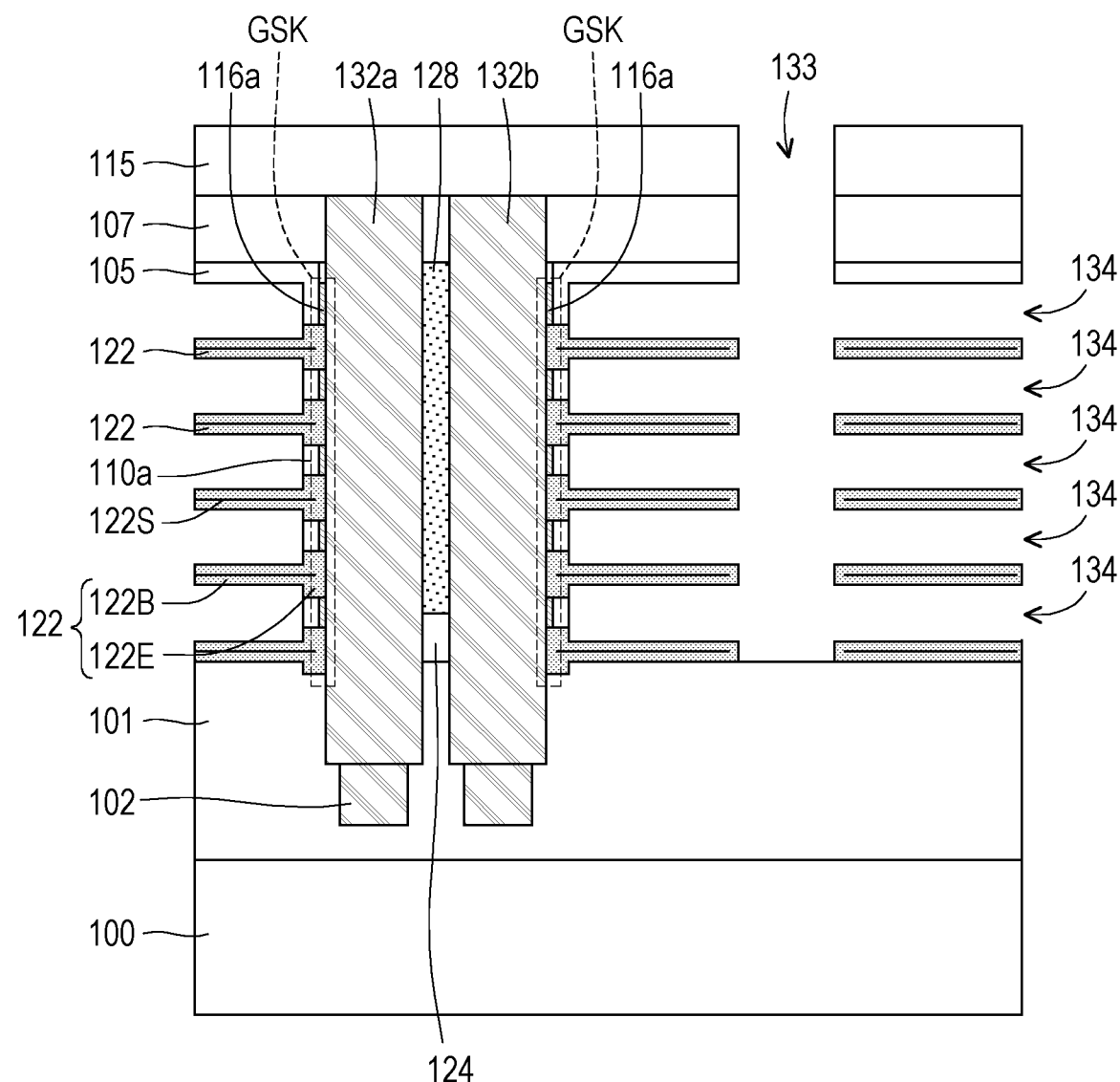

Referring to FIG. 2J, a replacement process is performed to replace intermediate layers 106 with gate layers 136 and charge storage structures, etc. First, an etching process such as a wet etching is performed to partially remove the intermediate layers 106. Since the etching solution (e.g., hot phosphoric acid) used in the etching solution is injected into the slit trench 133 to remove the intermediate layers 106 exposed by the slit trench 133. When the intermediate layers 106 between the cannel rings 116a and the slit trench 133 are removed, the protection pillar serves as an etching sop layer to protect the channel rings 116a since the materials of the protection pillar 110 and the intermediate layers are different. The etching process is performed, with time mode control, to remove most of the intermediate layers 106, so as to form a plurality of horizontal openings 134.

Figure 2K:
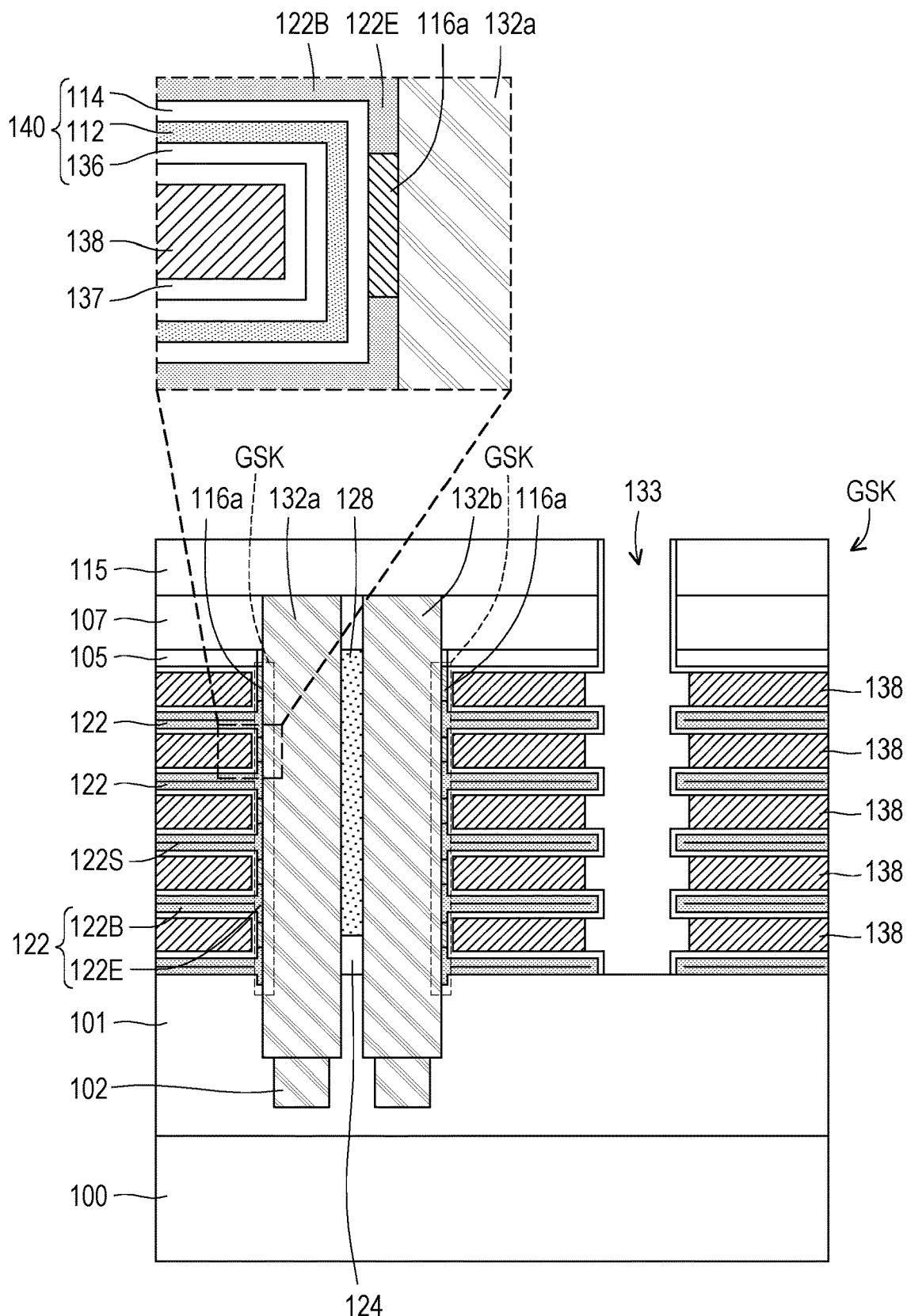

Referring to FIG. 2K, a protection pillar 110 is removed. A plurality of tunneling layers 114, a plurality of charge storage layers 112, a plurality of blocking layers 136, and a plurality of gate layers 138 are formed in the horizontal openings 134. The material of the tunneling layer 114 is, for example, silicon oxide. The material of the charge storage layer 112 is, for example, silicon nitride. The material of the blocking layer 136 is, for example, a high-k material having a dielectric constant greater than or equal to 7, such as aluminum oxide ($Al_2O_3$), hafnium oxide ($HfO_2$), lanthanum oxide ($La_2O_5$), transition metal oxide, lanthanide oxide, or combinations thereof. The material of the gate layer 138 is, for example, tungsten. In some embodiments, before the gate layers 138 are formed, a barrier layers 137 is formed. The material of the barrier layer 137 is, for example, titanium (Ti), titanium nitride (TiN), tantalum (Ta), tantalum nitride (TaN), or a combination thereof.

The method of forming the tunneling layer 114, the charge storage layer 112, the blocking layer 136, the barrier layer 137, and the gate layer 138 includes, for example, sequentially forming a tunneling material layer, a storage material layer, a blocking material layer, a barrier material layer, and a conductive material layer in the slit trench 133 and the horizontal opening 134. Then, an etch-back process is performed to remove the tunneling material layer, the storage material layer, the blocking material layer, the barrier material layer, and the conductive material layer in the slit trenches 133 to form the tunneling layer 114, the charge storage layer 112, the blocking layer 136, the barrier layer 137, and the gate layer 138 in the horizontal openings 134. The tunneling layer 114, the charge storage layer 112, and the blocking layer 136 are collectively referred to as a charge storage structure 140. At this time, a gate stack structure GSK is formed. The gate stack structure GSK is disposed on the dielectric substrate 100 and includes a plurality of gate layers 138 and a plurality of intermediate layers 104 stacked alternately with each other.

Figure 2L:
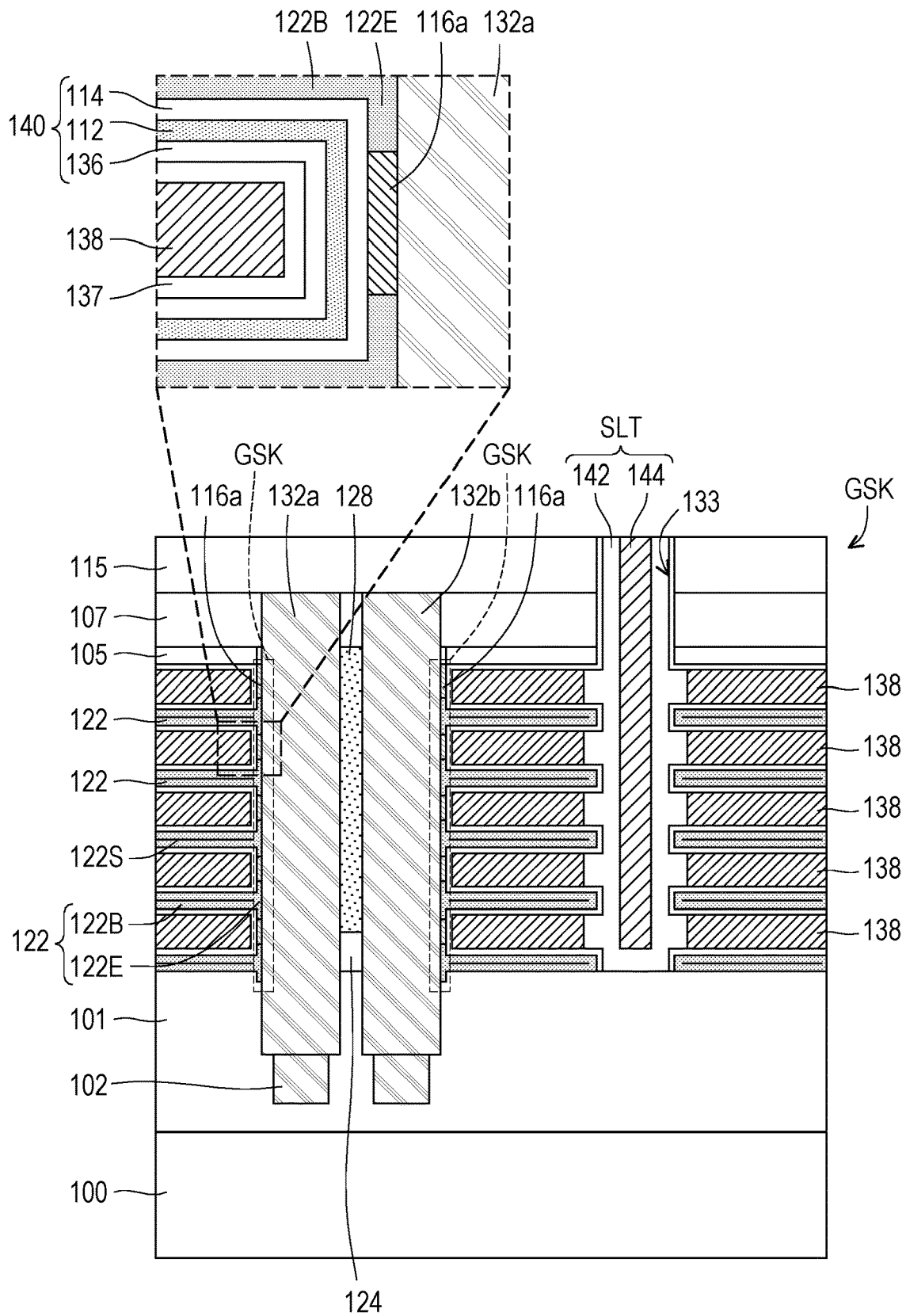

Referring to FIG. 2L, a slit structure SLT is formed in the slit trench 133. The method of forming the slit structure SLT includes filling an insulating liner material and a conductive material on the gate stack structure GSK and in the slit trench 133. The insulating material is, for example, silicon oxide. The conductive material is, for example, polysilicon. Then, the excessive insulating liner material and conductive material on the gate stack structure GSK are removed through an etch-back process or a planarization process to form a liner layer 142 and a conductive layer 144. The liner layer 142 and the conductive layer 144 are collectively referred to as a slit structure SLT. In other embodiments, the slit structure SLT may also be fully filled with an insulating material without any conductive layer. In still other embodiments, the slit structure SLT may also be a liner layer 142, and the liner layer 142 covers an air gap without any conductive layer.

Afterwards, contacts (not shown) are formed in the staircase region. The contacts land on the ends of the gate layers 138 in the staircase region and are electrically connected to the gate layers 138, respectively.

A method of forming a 3D AND flash memory device of the disclosure can be applied to a three-dimensional NOR flash memory device, and can be integrated with the existing process, in which a channel pillar penetrating through the gate stack structure is cut into a plurality of channel rings. These channel rings are physically separated from each other with insulating layers. This helps the gate layer to control the channel regions, so as to reduce leakage current, increase the device window, and increase the current ratio between on and off ($I_{on}/I_{off}$).

What is claimed is:
1. A 3D AND flash memory device, comprising:
   a gate stack structure, located on the dielectric substrate, wherein the gate stacked structure comprises a plurality of gate electrodes and a plurality insulating layers alternately stacked;
   a channel stack structure, extending through the gate stack structure, wherein the channel stack structure comprises a plurality of channel rings separated from each other;

a source pillar and a drain pillar, disposed in the channel stack structure and electrically connected to the channel rings, respectively; and a plurality of charge storage structures, located between the plurality of gate layers and the plurality of channel rings.

2. The 3D AND flash memory device of claim 1, wherein the plurality of insulating layers are between the plurality of channel rings, and between the plurality of gate layers, and the plurality of insulating layers, the plurality of channel rings and the plurality of gate layers form a composite stack structure.

3. The 3D AND flash memory device of claim 1, wherein the plurality of insulating layers comprise:

a plurality of body portions, wherein the plurality of body portions and the plurality of gate layers alternately stacked; and a plurality of extending portions, connected to the plurality of body portions, wherein the plurality of extending portions and the plurality of channel rings are alternately stacked to form the channel stack structure.

4. The 3D AND flash memory device of claim 3, wherein a height of the plurality of extending portions is less than a height of the plurality of body portions.

5. The 3D AND flash memory device of claim 3, wherein a height of the plurality of extending portions is equal to a height of the plurality of body portions.

6. The 3D AND flash memory device of claim 3, wherein a height of the plurality of extending portions is greater than a height of the plurality of body portions.

7. The 3D AND flash memory device of claim 1, wherein at least one of the plurality of insulating layers has an interface, a slit or a void.

8. A method of fabricating a 3D AND flash memory device, comprising:

forming an intermediate stack structure on dielectric substrate, wherein the intermediate stack structure comprises a plurality of first intermediate layers and a plurality of second intermediate layers alternately stacked;

forming an opening in the intermediate stack structure;

forming a protection pillar on a sidewall of the opening;

forming a channel pillar on a sidewall of the protection pillar;

forming a source pillar and a drain pillar in the channel pillar, wherein the source pillar and the drain pillar are electrically connected to the channel pillar;

removing the plurality of first intermediate layers by using the protection pillar as a stop layer, so as to form a plurality of first horizontal openings;

removing a portion of the protection pillar exposed by the plurality of first horizontal openings and cutting the channel pillar, so as to form a plurality of ring spaces, a plurality of protection rings and a plurality of channel rings, wherein the plurality of protection rings and the plurality of channel rings are separated by the plurality of ring spaces;

forming a plurality of insulating layers in the plurality of first horizontal openings and the plurality of ring spaces, wherein the plurality of channel rings and the plurality of insulating layers filled in the plurality of ring spaces are alternately stacked to from a channel stack structure;

removing the plurality of the second intermediate layers and the plurality of protection rings, so as to form a plurality of second horizontal openings;

filling a plurality of gate layers in the plurality of second horizontal openings, wherein the plurality of gate layers and the plurality of insulating layers filled in the plurality of first horizontal openings are alternately stacked to from a gate stack structure; and forming a plurality of charge storage layers between the plurality of gate layers and the plurality of channel rings, respectively.

9. The method of claim 8, wherein the plurality of first intermediate layers, the plurality of second intermediate layers, and the protection pillar comprise different materials.

10. The method of claim 9, wherein the plurality of first intermediate layers comprise a semiconductor material, and the plurality of second intermediate layers and the protection pillar comprise dielectric materials.

11. The method of claim 10, wherein the plurality of first intermediate layers comprise undoped polysilicon, the plurality of second intermediate layers comprise silicon nitride, and the protection pillar comprises silicon oxide.

12. The method of claim 8, wherein forming the plurality of insulating layers in the plurality of first horizontal openings and the plurality of ring spaces comprises forming interfaces, slits or voids within the plurality of insulating layers.

13. The method of claim 8, wherein removing the plurality of first intermediate layers comprises using alkaline solution.

14. The method of claim 8, wherein the plurality of insulating layers are between the plurality of channel rings, and between the plurality of gate layers, and the plurality of insulating layers, the plurality of channel rings and the plurality of gate layers form a composite stack structure.

* * * * *